United States Patent [19]
Nakata

[11] Patent Number: 5,785,768
[45] Date of Patent: Jul. 28, 1998

[54] PHOTO CELLS, PHOTO CELL ARRAYS, AND ELECTROLYTIC DEVICES USING THESE CELLS AND ARRAYS

[76] Inventor: Josuke Nakata, 112-17, Kusekamiohtani, Joyo-shi, Kyoto 610-01, Japan

[21] Appl. No.: 666,345

[22] PCT Filed: Jul. 3, 1995

[86] PCT No.: PCT/JP95/01319

§ 371 Date: Jul. 24, 1996

§ 102(e) Date: Jul. 24, 1996

[87] PCT Pub. No.: WO96/13070

PCT Pub. Date: May 2, 1996

[30] Foreign Application Priority Data

Oct. 24, 1994 [JP] Japan .................. 6-284217

[51] Int. Cl.$^6$ .................................. H01L 31/06
[52] U.S. Cl. .................. 136/250; 136/255; 136/261; 257/465; 257/466; 204/252; 205/340; 205/637
[58] Field of Search .................. 136/250, 255, 136/261; 257/465–466; 204/252, 242, DIG. 3; 205/340, 615, 628, 637, 923; 429/111

[56] References Cited

U.S. PATENT DOCUMENTS

| | | | |
|---|---|---|---|
| 4,021,323 | 5/1977 | Kilby et al. | 136/246 |
| 4,173,494 | 11/1979 | Johnson et al. | 136/250 |
| 4,315,973 | 2/1982 | Manassen et al. | 429/111 |
| 4,633,030 | 12/1986 | Cook | 136/246 |
| 4,643,817 | 2/1987 | Appleby | 204/242 |
| 4,722,776 | 2/1988 | Murphy et al. | 204/242 |
| 5,081,049 | 1/1992 | Green et al. | 437/2 |

FOREIGN PATENT DOCUMENTS

| | | | |
|---|---|---|---|
| 62-101084 | 5/1987 | Japan | 136/255 |
| 3-38359 | 4/1991 | Japan | 204/242 |
| 4-13880 | 1/1992 | Japan | 204/242 |
| 4-296060 | 10/1992 | Japan | 136/249 TS |

OTHER PUBLICATIONS

Form PCT/ISA/210 for PCT/JP95/01319.

*Primary Examiner*—Nam Nguyen
*Attorney, Agent, or Firm*—Finnegan, Henderson, Farabow, Garrett & Dunner, L.L.P.

[57] ABSTRACT

A photo cell and a photo cell array which have high photoelectric conversion efficiency, little leakage current, long life, and high reliability, as well as a electrolytic device that employs the cell and array. The photo cell (1) comprises: a base material (2) consisting of p-type semiconductor; a light receiving section (3) being an integral spherical part of the base material (2) which protrudes outward from the surface of the base (2), and has an n-type semiconductor layer formed on the surface of said spherical part, so that a pn junction interface is formed between the base material (2) and the semiconductor layer; a front surface electrode (4) formed from conductive material in ohmic contact with a portion of the surface of the aforementioned sphere; and a lower or back electrode (5) formed from conductive material on the bottom of the aforementioned base material (2), to provide ohmic contact. The spherical shape of the photo cell (1) enables most of the surface of the sphere to be sensitive to light, with wider directivity than flat photo cells, and enables uniform sensitivity regardless of direction.

12 Claims, 7 Drawing Sheets

PHOTO CELLS, PHOTO CELL ARRAYS, AND ELECTROLYTIC DEVICES USING THESE CELLS AND ARRAYS

BACKGROUND OF THE INVENTION

This invention relates to photo cells and photo cell arrays, such as solar cells and photo diodes, as well as electrolytic devices having these cells and arrays as structural constituents.

Solar cells make use of the solar energy that radiates upon the Earth. Solar cells were developed because of the limits inherent in using fossil fuels as an energy source. Solar cells provide energy for calculators, wristwatches, and other common applications. One problem in employing solar cells, however, has been that solar radiation energy is available only in low energy density on the earth. To obtain the equivalent level of electric power from solar cells as can be obtained from a thermal power station would require the collection of radiation over a considerably large area.

To resolve this problem, a proposal was put forth for the use of solar cells comprising silicon semiconductors, which generate a photovoltaic power and are fabricated in spherical form, allowing the absorption of sunlight from all angles, and the use of electrolytic devices employing said solar cells (U.S. Pat. No. 4,021,323).

The method of manufacturing solar cells described in this U.S. Patent is as follows. First, molten silicon is ejected out of small nozzle into an inert gaseous atmosphere, forming a p-type or n-type silicon sphere. The surface of this silicon sphere is subjected to a gaseous diffusion process using either phosphorous (P) or boron (B) which forms a pn junction at a certain depth below the surface of the sphere. Next, the surface of the sphere is sputtered with platinum or a similar metal to create a thin, light transmissive metallic layer, on top of which a coating of insulating resin is then applied. The silicon sphere is then affixed to a temporary substrate, and a corrosion-resistant, light transmissive insulating compound, such as silicone resin, is poured around its circumference. After the insulating compound is cured, the top surface is removed, exposing the silicon sphere. A layer of aluminum or other similar metal is then ion plated onto the exposed surface of the sphere, making ohmic contact with the sphere. Finally, the temporary substrate is removed and the solar cell is completed.

With the solar cells described in the U.S. patent listed above, however, when the silicon is melted in the manufacturing process, the molten silicon does not come in contact with the seed of a single crystal, so the resultant silicon sphere does not grow as a single crystal and its energy conversion efficiency is poor. Before ion plating of the electrode made from aluminum or a similar metal, the possibility exists of large leakage current on the surface of the edge of the pn junction at the exposed silicon sphere.

The objective of the invention is to provide photo cells and photo cell arrays made from single crystal or polycrystal semiconductor material having a crystalinity close to that of single crystals and which have high photoelectric conversion efficiency, little leakage current, long life, and high reliability, as well as electrolytic devices that employ these cells and arrays.

SUMMARY OF THE INVENTION

The photo cells of this invention, in order to achieve the objectives outlined above, have base material, a light receiving section, a front surface electrode, and a back or lower surface electrode as their main components:

The base material consists of p-type (or n-type) semiconductor.

The light receiving section is an integral spherically shaped part of the base material, and protrudes outwardly from the surface of the base. On the surface of said spherical part there is attached a semiconductor layer of n-type (or p-type), that is, opposite to the base material conductivity type. Further, between the aforementioned base material and semiconductor layer there is formed a pn junction interface.

The front surface electrode is formed from conductive material that is in ohmic contact with a portion of the front surface of the aforementioned sphere.

The back or lower surface electrode is formed from conductive material on the underside of the aforementioned base material, to provide ohmic contact therewith.

BRIEF DESCRIPTION OF THE DRAWINGS

FIG. 1(b) a cross sectional view taken along the line 1(b)—1(b) of FIG. 1(a); FIG. 1(c) an equivalent electrical circuit drawing; and FIG. 1(d) an equivalent electrical circuit drawing of another photo cell similar to said photo cell;

FIG. 6(b) a cross sectional view taken along the line 6(b)—6(b) of FIG. 6(a); and FIG. 6(c) is a bottom view of the electrolytic device.

DETAILED DESCRIPTION OF THE INVENTION

Figure 1A:
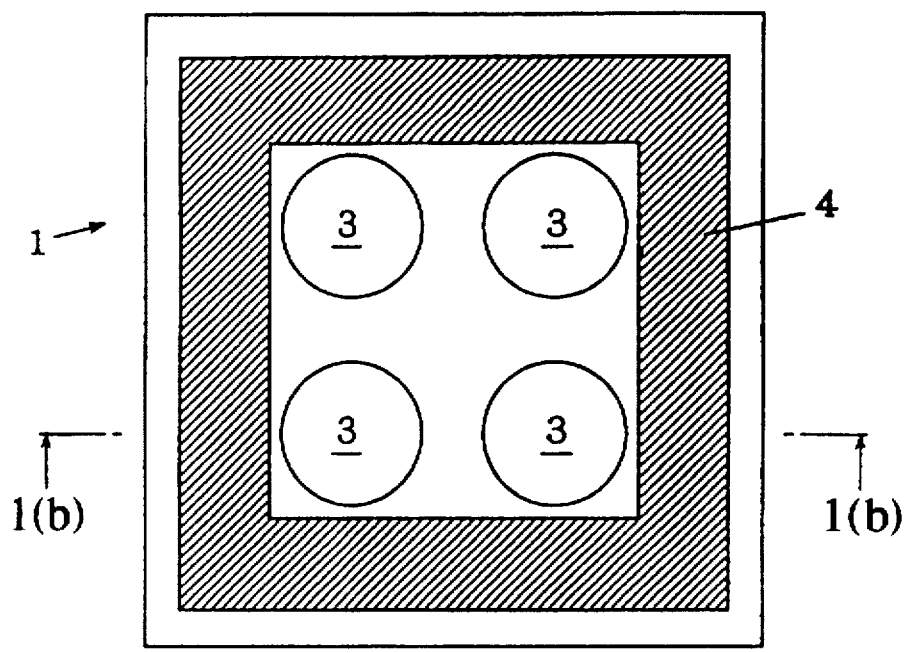
FIGS. 1(a)–(d) illustrate an embodiment of the photo cell of the invention, with FIG. 1(a) being a plan view thereof.
Figure 1B:
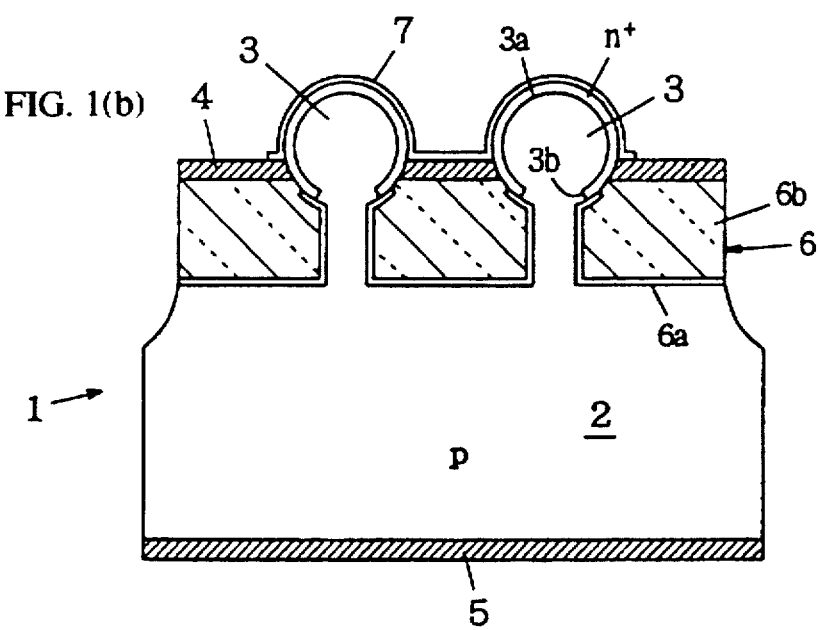
Figure 1C:
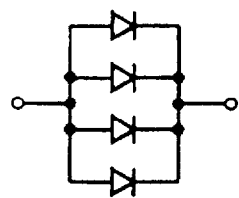
Figure 1D:
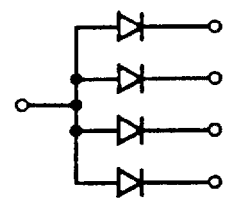

The term photo cell as used herein means a solar cell, photo diode, photo transistor, and other photoelectric devices.

When the photo cell is used as a solar cell, it is preferable that the semiconductor be of silicon. It is also preferable that glass or some other layer of insulation be attached from the surface of the base material up until it covers a portion of the surface of the sphere(s) and that the edge of the pn junction be lower in position than the surface of said insulation layer, so that it is covered by the insulation layer. It is particularly preferable that the surface electrode be on the surface of said insulation layer, especially a surface electrode made from material possessing photoreflective characteristics. It is also advisable that some of these photo cells have multiple light receiving sections for each piece of base material and that the underside electrode be common to these multiple light receiving sections.

The photo cell array of this invention, in order to achieve the objectives outlined above, has as its main features:

Two of the aforementioned photo cells are anchored in a common substrate that has a conductive surface. The conductivity types of the base material of the photo cells are different from each other, and the junction of each of the underside electrodes and the aforementioned conductive surface creates a series electric connection.

A first electrolytic device of this invention, in order to achieve the objectives outlined above, has as its main components:

the aforementioned photo cell arrays;

electrolyte filling the space between each of the surface electrodes; and a diaphragm separating the surface electrodes of photo cells that have base material of different conductivity types from each other;

so that the photovoltaic power generated by the light receiving sections causes the electrolysis of the electrolyte.

In the same manner, a second electrolytic device of this invention has as its main components:

the two aforementioned photo cells, having base material of different conductivity types from each other;

a substrate having two separated conductive surfaces and separately supporting the two photo cells on each of the conductive surfaces;

an electrolytic cell surrounding the two aforementioned photo cells, fixed in place on the substrate so as to be liquid-impermeable;

electrolyte filling the electrolytic cell and the space between the surface of the spheres of the two aforementioned photo cells and each surface electrode;

a diaphragm separating the surface electrodes of the photo cells that have base materials of different conductivity types from each other; and external solar cells connected in series with the two types of aforementioned photo cells on the exterior of the electrolytic cell.

The components are arranged so that the total of the photovoltaic power supplied by the light receiving sections of the aforementioned two types of photo cells and the photovoltaic power supplied by the external solar cells causes the electrolysis of the electrolyte.

The electrical connection between the photo cells within the electrolytic cell and the external solar cells may be such that the supporting surface of the substrate is formed broadly, spreading outward from the electrolytic cell, and the wiring is formed either within the substrate or on its surface, with the external solar cells affixed to said protruding substrate surface and connected in series via the wiring to the aforementioned two types of photo cells.

The photo cells of this invention enable electromotive power to be produced from both sides of a pn junction, when sunlight or other sources illuminate light receiving sections that have a spherical pn junction interface. When this pn junction interface is reverse biased from an external source, the photoelectric current flows to both ends, in response to the quantity of photon or radiation power. In such cases, the smaller the radius of the light receiving sections is made, the larger the ratio of surface area to volume becomes. This allows the surface area where light enters to be larger than it would be for photo cells having a flat surface of identical volume, contributing to increased output or compact design.

The spherical shape of the photo cells enables most of the surface of the sphere to be sensitive to light, with wider directivity angle than flat photo cells, and enables uniform sensitivity regardless of direction. This means that there is little restriction with regard to direction when the units are mounted. The length (L) of the edge of the pn junction is equivalent to the circumferential length of the sphere, so positioning the edge of the pn junction along a circumference with a smaller diameter than the actual sphere diameter enables a notably small ratio of length to pn junction interface area (L/S) to operate successfully, compared with that of a flat photo cell. This enables lower levels of leakage from the pn junction edge and results in only a small probability of deterioration or instability. These features result in highly reliable photo cells with good photoelectric conversion efficiency and a large signal-to-noise (S/N) ratio.

Solar cells and photo diodes are appropriate applications of these devices when the base material of the receptor is made from silicon semiconductor.

When a layer of insulation covers the photo cells from the surface of the base material to a portion of the sphere surfaces and the edge of the pn junction exists below the surface of the insulation layer, allowing the insulation to cover the pn junction, the edge of the pn junction will not cause deterioration or short circuiting of the base material. Particularly, there is no corrosion or shorting caused by the electrolyte. This is ideal for electrolytic devices. When glass is used as the insulation layer material, it serves not only as insulation but provides excellent liquid-impermeability and corrosion resistance.

When the surface electrode for the photo cells exists across the entire surface of the insulation, it is not necessary to have wiring to connect the surface electrodes of each of the light receiving sections to each other. When these surface electrodes are made from material possessing photoreflective qualities, they reflect the light that enters the device and provide added benefit by working to direct the incidental light to the light receiving sections, heightening the photoelectric conversion efficiency of all of the light that enters the device.

The photo cells of this invention can accommodate a plurality of light receiving sections for each piece of base material. When arranged in such a way, the light receiving sections and the base material are also linked as a whole, enabling these multiple numbers of light receiving sections to have a common underside electrode. This means that there is no need for wiring to connect each of the light receiving sections, regardless of whether there is one or many light receiving sections. Any problems with continuity can therefore be avoided beforehand, precise alignment of the light receiving sections is made possible, and assembly of large-scale solar cells is simplified.

The aforementioned photo cell array has a structure such that two photo cells are arranged on a common substrate, wherein the conductivity types of the base materials are different from each other. The junction of each of the underside electrodes and the conductive surface of the substrate surface results in the electrical connection of the photo cells in series, without wiring, thereby enabling the photo cell array to double the electromotive power.

The aforementioned first electrolytic device is such that the surface electrodes of the photo cell having a base material of p-type semiconductor and a sphere surface of n-type semiconductor layer is the cathode and the surface electrodes of the photo cell that has a base material of n-type semiconductor and a sphere surface of p-type semiconductor layer is the anode, with a diaphragm separating these positive and negative poles. The photovoltaic power provided by the light receiving sections forces the electrolysis of the electrolyte. If, for example, the base material is silicon and a hydrogen bromide (HBr) aqueous solution is chosen as the electrolyte, irradiation by the sunlight produces hydrogen on the cathode side, which can be extracted and used as fuel.

If, in this example, the base material is made from silicon, the output voltage of a single photo cell is approximately 0.6 volts, even with solar radiation energy of 60 mW×cm$^2$ or more. This does not provide the voltage required for the electrolysis of water, even if two photo cells are connected in series.

The aforementioned second electrolytic device, therefore, has the necessary number of separate pn-type solar cells wired to the outside of the electrolytic cell, connecting in series each of the aforementioned photo cells. This makes possible the supplementing of what would be insufficient voltage with photo cells alone, enabling electrolysis that requires high voltage, such as the electrolysis of water. To make such a device compact, the photo cells within the electrolytic cell and the solar cells outside of the container are anchored into a common substrate, with external solar cells preferably connected in series to the light receiving sections within the container via wiring formed either within or on the surface of the substrate. This allows the elimination of troublesome electrical connection operations.

EXAMPLE 1

Example 1 is a photo cell explained in conjunction with FIGS. 1(a) to (d).

Photo cell 1 comprises a base material 2, spherically shaped light receiving sections 3, front surface electrode 4, and lower or back electrode 5. The plate-like base material 2 is made from single crystal p-type silicon semiconductor. The light receiving sections are integral spherical parts of the base material 2, which protrude outward from the surface of the base. On the surface of each of said spherical parts 3 there is an n-type silicon semiconductor layer. There are four light receiving sections 3 having pn junction interfaces 3a formed between the n-type semiconductor layer and the p-type base material. The front surface electrode (cathode) 4 is formed of two layers made from gold (Au) as the upper layer and nickel (Ni) as the lower layer, in ohmic contact with the external periphery of the lower hemisphere of the n-type semiconductor layer on the surface of each of the aforementioned light receiving section spheres. The back or lower electrode (anode) 5 is formed from the same conductive material as the front surface electrode, such that there is ohmic contact with the underside of the aforementioned base material 2.

A layer of insulation 6 is formed on photo cell 1, covering from the surface of base material 2 up to a portion of the lower hemisphere of the surface of the aforementioned spheres and having an upper surface parallel to that of base material 2. The front surface electrode 4 is formed on the surface of this layer of insulation 6. Insulation layer 6 is made from a thin silicon dioxide ($SiO_2$) film 6a formed along the surface of base material 2 and a thick layer of glass 6b formed thereover.

Over the central portion of the cathode surface, including the exposed portion of the light receiving sections 3, there is formed an anti-reflection coating 7 made from titanium dioxide ($TiO_2$). The perimeter of the square frame of the cathode surface, however, is left exposed as the connection terminal for a lead wire or other external circuit. The surface of the photo cell 1 is passivated against air by the layer of glass 6(b) covering the pn junction edge. By connecting each of the front surface electrode 4 and the back electrode 5 to an external lead, this photo cell 1 can be used as it is as a photo diode or a solar cell.

The following is a method used for the fabrication of the aforementioned photo cells.

(1) First, a p-type single crystal silicon semiconductor wafer with a resistance of 1–2 Ω cm is prepared to be used as the base material 2. A crosscut pattern is cut into the main surface of the wafer using a diamond saw, to create a plurality of rectangular column-shaped protruding arrays. Alternatively, the silicon wafer is subjected to ultrasonic machining to create a plurality of circular column-shaped protruding arrays. In either case, the length of one side of the cross sectional square of the rectangular columns or the diameter of the cross sectional circle of circular columns is set to an appropriate length for the application, within the range of 0.1–0.5 mm. Then, any mechanically damaged and strained layers generated during cutting processing are etched away. Next, the silicon dioxide ($SiO_2$) film is formed by thermally oxidizing the surface of the wafer, including the protruding arrays. The silicon dioxide film of the protruding part is then etched away, leaving the silicon dioxide film to a certain height above the main surface of the wafer. The wafer is set firmly in place, and the protruding part is melted using a heat beam from a carbon dioxide laser or an infrared lamp. Molten globules or spheres, are created by the surface tension. Irradiation by the heat beam is stopped at this point and recrystallization is allowed to occur from the roots that did not melt. At this time, the oxide film remaining at the roots of protruding parts prevents the molten spheres from losing their shape. If using a kind of material such that the surface tension of the molten liquid is low or the mass is large, rendering it difficult for the spheres to maintain their shape, recrystallization can be performed under micro gravity.

(2) After hydrofluoric acid (HF) or another substance is used to completely dissolve away the oxide film, a complete oxide film is formed by thermal oxidation. At this stage, undesirable heavy-metal impurities are absorbed by the oxide film, reducing lattice defects and crystal dislocation. When it is desirable to prolong the carrier lifetime in the substrate of the spherical light receiving sections, oxide films that have absorbed impurities are dissolved using HF or a similar substance and the thermal oxidation operation can be repeated.

(3) The oxide film on the recrystallized surface of the spheres is removed to within the vicinity of the unmelted columns, using an etching fluid of hydrofluoric acid or a similar substance. The protruding surface is subjected to a thermal diffusion process using phosphorous P to form an n$^+$ layer while utilizing the oxide film 6a as a mask. At this time, since the oxide film 6a of the protruding surface remains up to the vicinity of the columns, the edge 3b of the pn junction is propagated by phosphorous diffusion and penetrates underneath edge of the oxide film 6a, and the edge surface is protected by the film 6a. The length L of the edge 3b of the pn junction is equivalent to the circumferential length of the sphere, enabling the ratio of the pn junction to the interface area S (L/S) to be smaller than for a flat photo cell. This reduces the probability of any leakage current occurring at pn junction edge 3b and minimizes leakage current occurring during the fabrication process. The depth from the surface of the sphere to the surface of the pn junction is 0.5–1.0 μm and the surface concentration of phosphorous is approximately $2 \times 10^{20}$ cm$^{-3}$. The protruding portion has now been made into a light receiving section 3, possessing a spherical pn junction interface.

(4) Next, a suspension containing finely powdered lead glass having a high melting point is prepared and the fine glass powder is adhered to the top of the base material 2, using a method of sedimentation or electrophoresis. The thickness of this coating, however, is set such that the height of the surface of the insulating glass after firing is below the upper hemisphere of the light receiving section 3 and above the upper end of aforementioned oxide film 6a, so that at the very least the upper hemisphere of the light receiving section is exposed. Firing is performed at approximately 850° C. to form the layer of insulating glass 6b. The thin oxide film on the surface of the spherical crystal which is to make a connection with the electrodes and the residual glass film are etched away using hydrofluoric acid or a similar substance, thereby exposing a clean silicon surface.

(5) The surface of the layer of insulating glass 6b, the surface of the upper hemisphere of the light receiving sections 3, and the underside of the base material 2 are plated electrolessly with nickel (Ni) and gold (Au), in that=order, making ohmic contact with each of the light receiving sections and the underside of the base material. The layer of plating on the underside of the base material becomes lower or back electrode 5. In this way the light receiving sections 3, which have a spherical pn junction interface, and the base material 2 are integrally linked, and the back electrode 5 is in common with all of the light receiving sections 3, thereby eliminating the necessity of connecting each of the light receiving sections using wires. This enables any problems with continuity to be prevented before they occur. Vapor plating can also be performed instead of electroless plating. The next step is to mask the nickel and gold plating such that only the upper hemisphere of the protruding part is exposed, and then the layer of plated metal on the protruding surface is removed using etching. The remaining layer of plating on the surface of the base material becomes front surface electrode 4, which touches the $n^+$ layer at the portion where the spherical crystal surface and the layer of insulating glass touch. This eliminates the necessity for individual wiring among respective front surface electrodes at each of the light receiving sections. The unit is then put into an electric furnace and thermally processed in a nitrogen or other inactive gaseous environment such that the $n^+$ type layer and the p-type baseboard respectively make good ohmic contact with each of the layers of plating. At this time, a thin oxide film unavoidably appears on the surface. This layer is etched away.

(6) Following the above procedure, a photoresist and metal mask are used so that the four light receiving sections 3 adjacent to one another on the surface of the base material are placed in a square enclosure. Silicon dioxide ($SiO_2$) and titanium dioxide ($TiO_2$), in that order, are used to form the anti-reflection coating 7 on the surface of the exposed base material, which includes the surface of the $n^+$ type layer, using plasma CVD or sputter deposition. Trisilicon tetranitride ($Si_3N_4$) may be substituted for the titanium dioxide ($TiO_2$).

(7) The mask is removed and the units are divided with a dicing saw such that each unit has four light receiving sections, as illustrated in FIG. 1 (a). It is not shown in the drawing, but the anodes are soldered to a metal stem and a lead frame, and gold wires are bonded onto the exposed surface of the cathodes, enabling external electrical contact. Photo cell 1 is completed by packaging the unit into a case or molding a transparent resin casing for it.

The photo cell 1 thus described has four light receiving sections 3 connected in parallel, as illustrated in FIG. 1 (c). If desired to divide the unit on the side of the front surface electrodes (cathodes) 4, the layer of plating on the surface of the base material can be cut crosswise using a laser or other device before the anti-reflection coating is formed. Then, the surface electrodes which have each been divided into four are individually bonded using a metal. If there is to be an external electrical connection, a photo cell possessing four cathode terminals, as illustrated in FIG. 1 (d), can be obtained.

This figure was explained in terms of an example whereby a unit contains four light receiving sections. It hardly need be said that the quantity of light receiving sections can be changed to suit particular needs.

The photo cell in the above example has pn junction interfaces below the surface of the light receiving sections 3, which, when irradiated by sunlight, produce photoelectromotive power at both sides of the pn junction. In such a case, the smaller the radius of the spherical portion of the light receiving section 3 is, the larger the ratio of surface area to volume becomes. This means that the surface area into which the sun's rays can enter is larger than that of a flat light receiving section of identical volume, contributing to increased output and compact design.

The spherical shape of the light receiving sections 3, which contain pn junctions, enables uniform photosensitivity regardless of the angle of irradiation to the base material. This means that there is little restriction with regard to direction when the units are mounted. The ratio (L/S) of the length (L) of the edge of the pn junction to the pn junction area (S) is small, so there is little leakage current on the pn junction edge. And because external gasses are shut out from the edges of the pn junction by a layer of insulating glass, there is no deterioration of the edges of the pn junction caused by the atmosphere or liquids, enabling the achievement of a highly-reliable light receiving section.

EXAMPLE 2

Figure 2A:
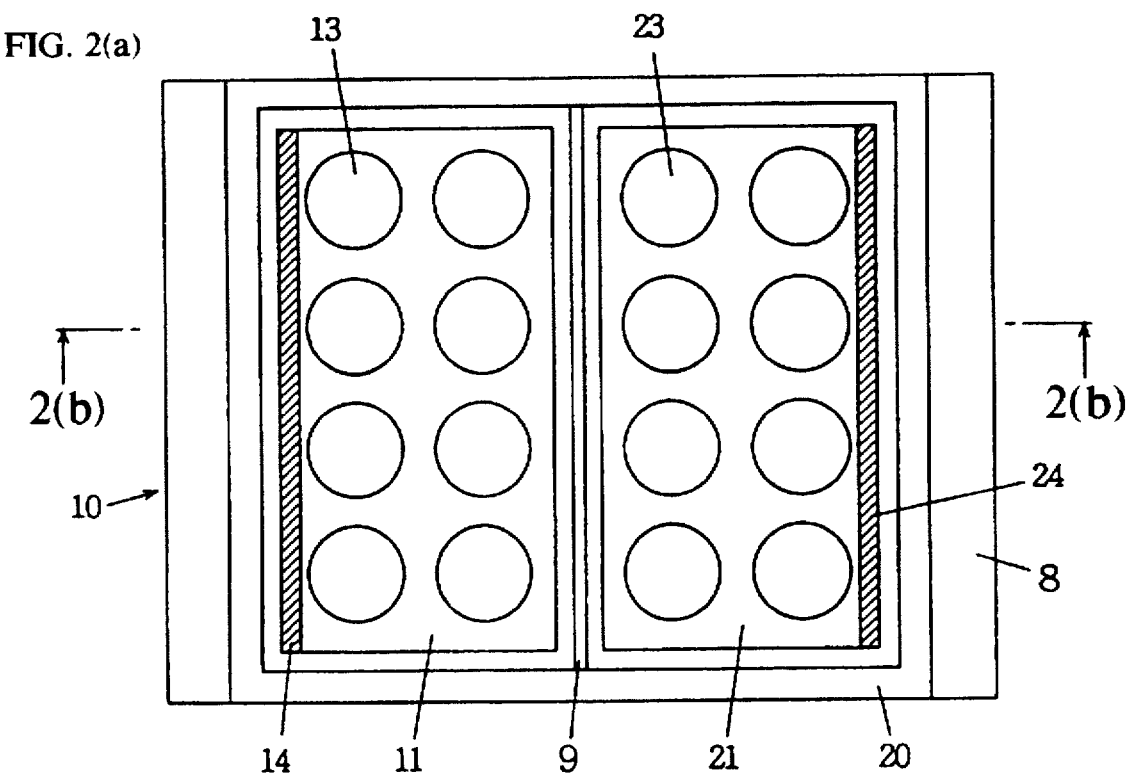
FIGS. 2(a) & (b) illustrate an embodiment of an electrolytic device, with FIG. 2(a) being a plan view thereof.
Figure 2B:
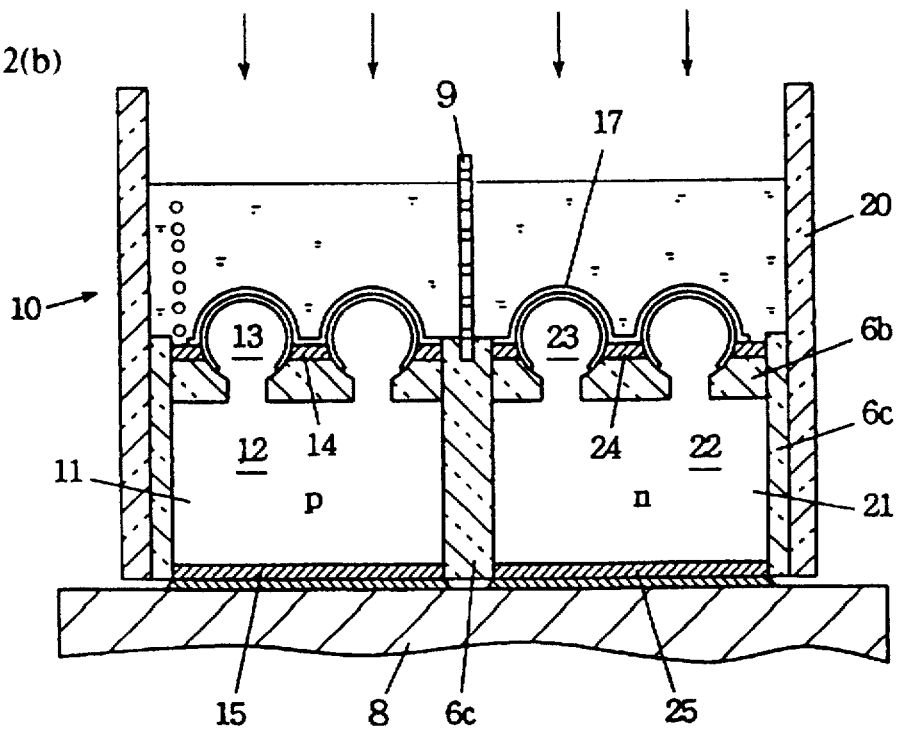
FIG. 2(b) a cross sectional view taken along the line 2(b)—2(b) of FIG. 2(a)
Figure 3:
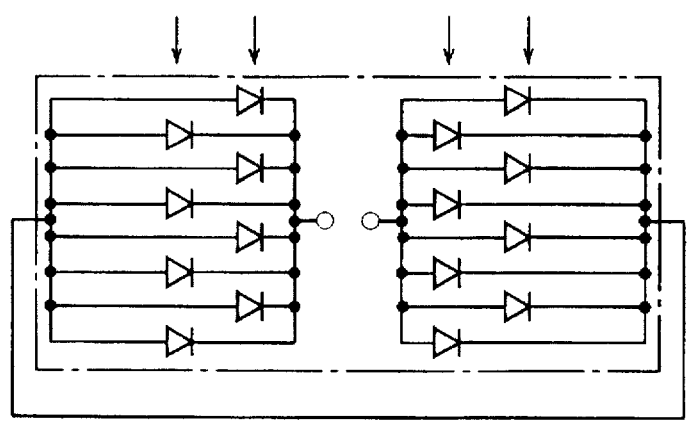
FIG. 3 is an equivalent electrical circuit drawing of the electrolytic device of FIGS. 2(a) & (b).

This example is for photo cells and arrays and an electronic device. The photo cell of this example is explained in conjunction with FIGS. 2(a) & (b) and FIG. 3.

Electrolytic device 10 comprises the following components;

1. photo cell 11 having as its base material 12 the same p-type silicon semiconductor wafer as that of EXAMPLE 1, except that the number of light receiving sections 13 is eight, 2. photo cell 21 having the same form and number of light receiving section 11, except that base material 22 has an n-type silicon semiconductor wafer instead of p-type semiconductor wafer (which means that the surface of the spherical light receiving section is a p-type layer)

3. a substrate 8 made from conductive material such as steel or copper onto which photo cells 11 and 21 are fixed, 4. electrolytic cell 20 made from hard glass ($SiO_2$: 80.6, $B_2O_3$:11.9, $Al_2O_3$: 2.0, $Na_2O$: 4.4, CaO+MgO: 1.1 [weight %]) which impermeably encloses photo cells 11 and 21, 5. a diaphragm 9 separating front surface electrode 14 of photo cell 11 and front surface electrode 24 of photo cell 21.

This embodiment of the invention differs from that of Example 1 in that the front surface electrode 14 of photo cell 11 is formed of two layers—a platinum upper layer and a palladium lower layer. The front surface electrode 24 of photo cell 21 also possesses the same qualities, but it differs from Example 1 in that base material 22 has an n conductivity type, rendering front surface electrode 24 an anode. By respectively soldering the back electrodes 15 (anode) and 25

(cathode) to the substrate 8, photo cells 11 and 21 are electrically connected in series. The assembled product containing photo cells 11 and 21 and the substrate 8 forms a photo cell array.

The light receiving section arrays, electrolytic cell 20, and diaphragm 9 are sealed with a glass ceramic 6c comprised of a mixture of ceramic powder and lead glass powder with a low melting point.

When the aforementioned electrolytic device 10 is filled with a hydrogen bromide solution and irradiated by sunlight from above, a photovoltaic power is produced by each of the photo cells 11 and 21, with a total photovoltage of between 1.0 and 1.2 volts generated between each of the anode 24 and cathode 14. This voltage serves to electrochemically dissociate the aqueous solution, and hydrogen is generated on the side of the surface electrodes 14 (cathodes). Simultaneously with hydrogen generation, the bromine ions freed from hydrogen bromide move toward the vicinity of surface electrodes (anodes) 24 and dissolve as bromine gas. What makes this electrolytic device 10 special is that the front surface electrodes 14 and 24 touch only each of the lower hemispheres of the light receiving sections 13 and 23, so the entire surface of the upper hemispheres can be used effectively, without any reduction in light receiving surface area caused by front surface electrodes 14 and 24. In addition, front surface electrodes 14 and 24 are made from platinum, which is corrosion resistant to the electrolyte and can be expected to provide catalytic action. The light that passes through the transparent anti-reflection coating 17 is reflected by the front surface electrode, irradiating the light receiving section and enabling the effective use of the surface area of the electrode as a light receiving section.

EXAMPLE 3

Figure 4A:
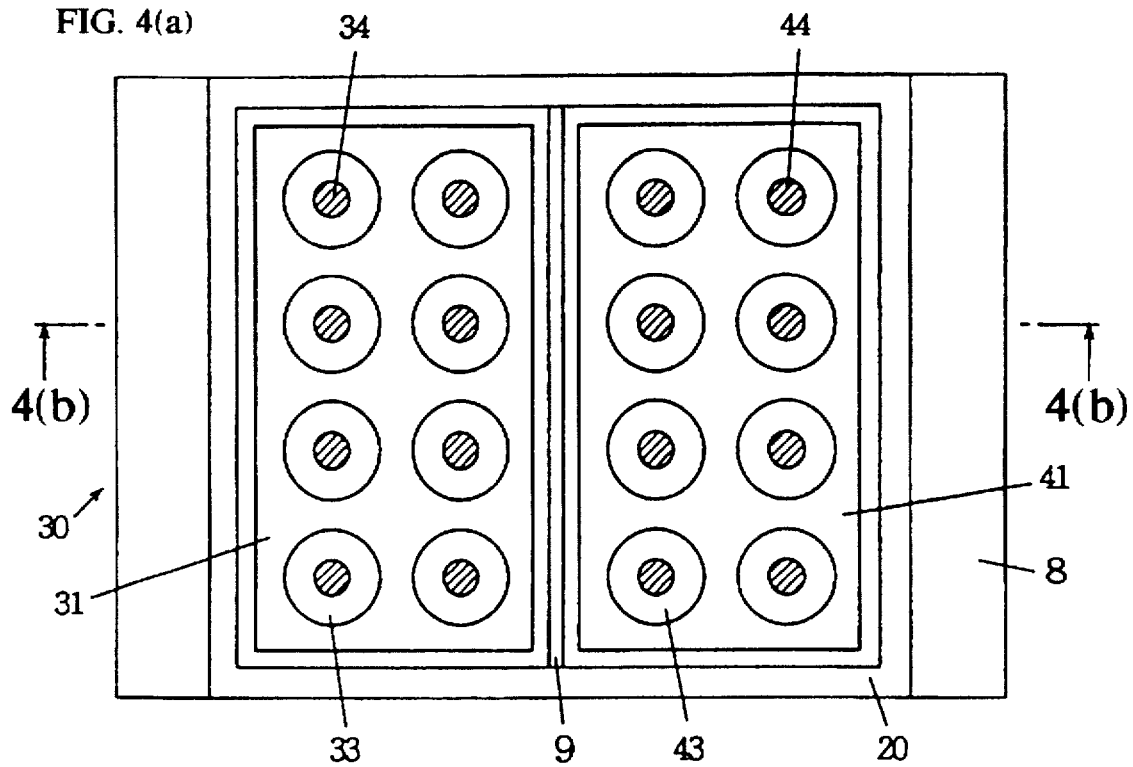
FIGS. 4(a) & (b) illustrate another embodiment of an electrolytic device, with FIG. 4(a) being a plan view thereof and FIG. 4(b) a cross sectional view taken along the line 4(b)—4(b) of FIG. 4(a)
Figure 4B:
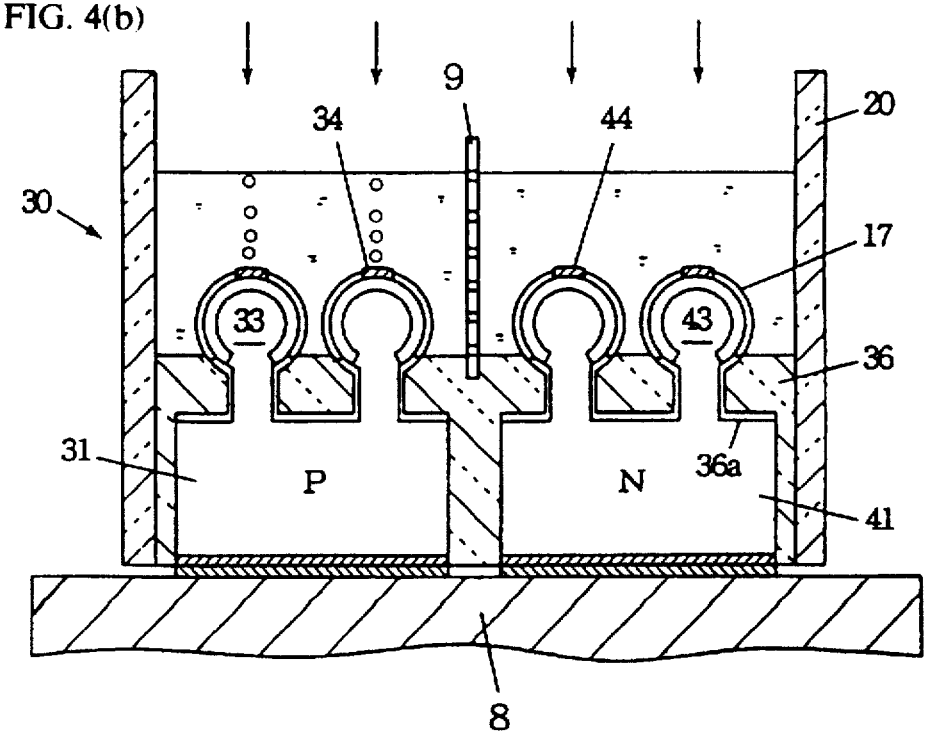
Figure 5:
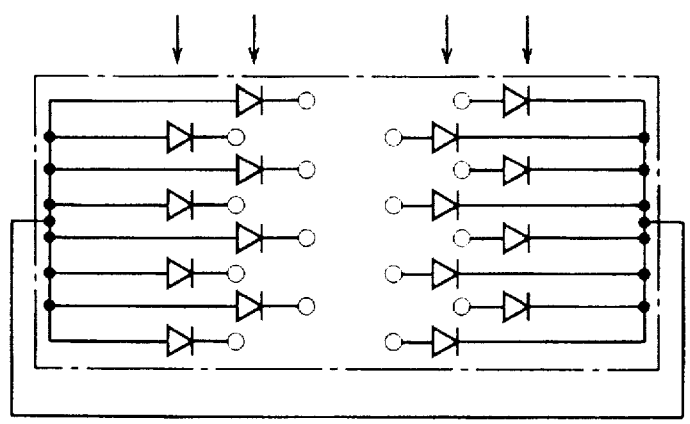
FIG. 5 is an equivalent electrical circuit drawing of the electrolytic device of FIGS. 4(a) & 4(b)

Example 3 is also for photo cells and arrays and an electrolytic device. This device differs from the previous embodiment in the shape of the surface electrodes. This example of a photo cell is explained in conjunction with FIGS. 4(a) and (b) and FIG. 5.

The front surface electrodes 34 and 44 of this electrolytic device 30 are not located on the surface of insulating layer 36 but are respectively formed on the top of the light receiving sections 33 and 43. For this reason, the entirety of insulating layer 36 is comprised of low-melting-point glass. Other than these points, the structure of this electrolytic device is identical with the electrolytic device 10 of Example 2.

Specifically, the front surface electrodes 14 and 24 of the electrolytic device 10 of the previous example are linked together on the surface of the insulating layer 6b that surrounds the light receiving sections which produce the photovoltaic power, whereas in this embodiment the front surface electrodes 34 and 44 are divided for each of the light receiving sections. With this arrangement, the anti-reflection coating 17 is formed in the same way as with Example 1, and the top of the spherical surface of the protruding parts are either ion beam sputter-etched, plasma etched, or gas etched, then front surface electrodes 34 and 44 are formed by the electroless plating or vaporization of palladium (Pd) and platinum (Pt), in that order, in the etched space. This manufacturing process does not require the application of heat on the insulating layer, so it is not necessary that the insulating layer be glass with a high melting point. This enables sealing glass of the same quality as the glass 6c with a low melting point in the previous example to serve also as an insulating layer.

When this electrolytic device 30 is irradiated by sunlight, a photovoltaic power with a total voltage of between 1.0 and 1.2 volts is generated, in the same way as with Example 2. What is special about this electrolytic device is that the surface electrodes 34 and 44 are divided separately for each of the light receiving sections 33 and 43 such that even if one of the light receiving sections 33 or 43 should short circuit, the other light receiving section would continue to work and the electrolytic reaction would continue to occur.

EXAMPLE 4

Figure 6A:
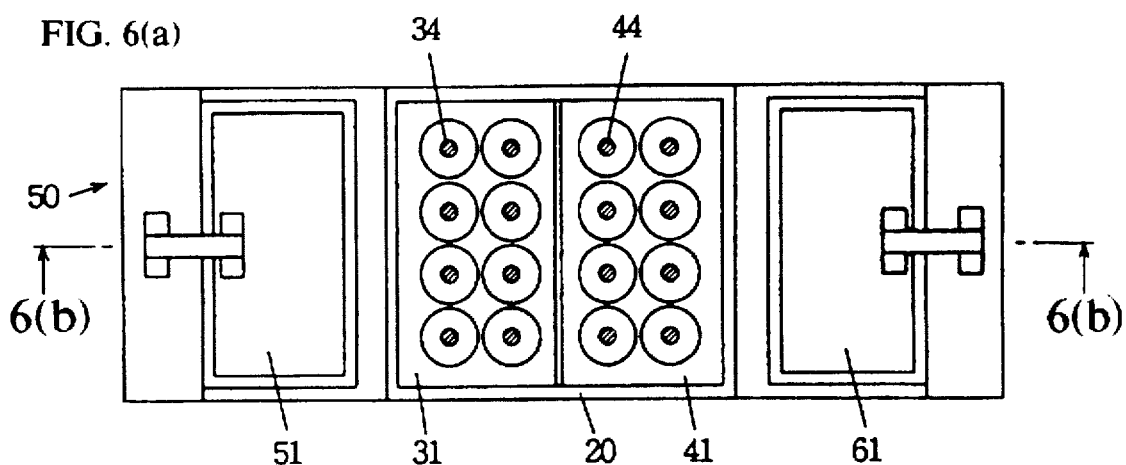
FIGS. 6(a)–(c) illustrate another embodiment of an electrolytic device, with FIG. 6(a) being a plan view thereof.
Figure 6B:
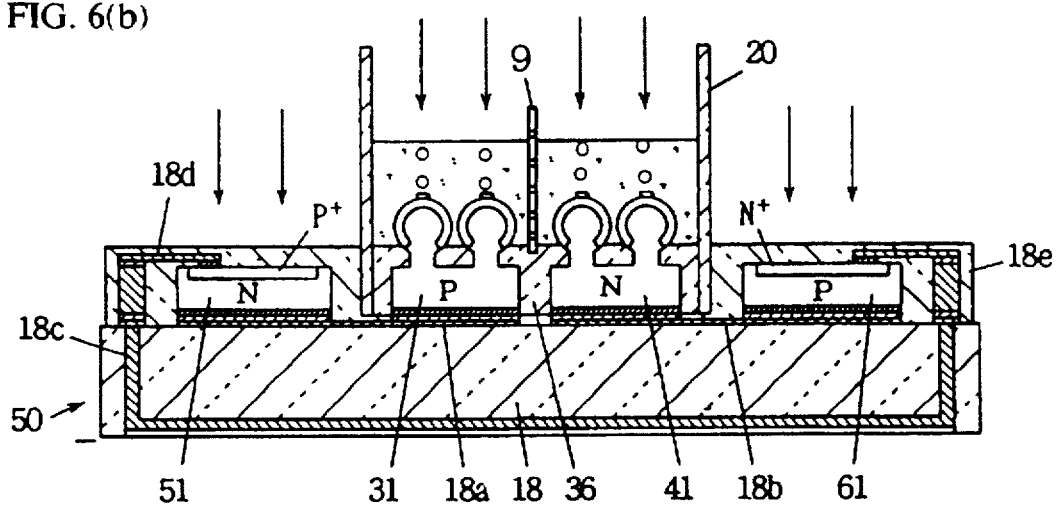
Figure 6C:
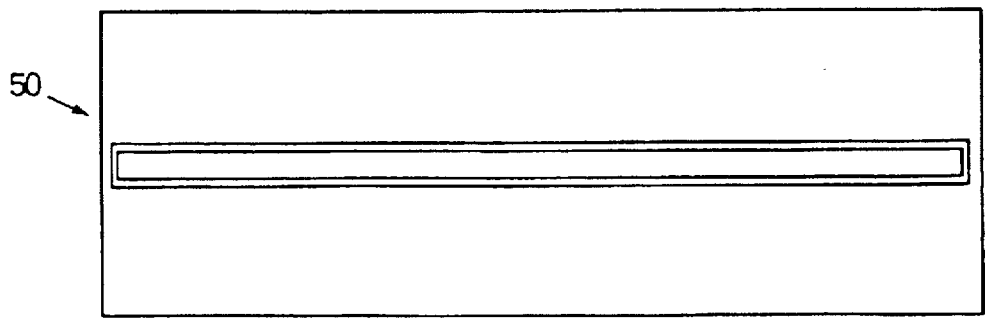
Figure 7:
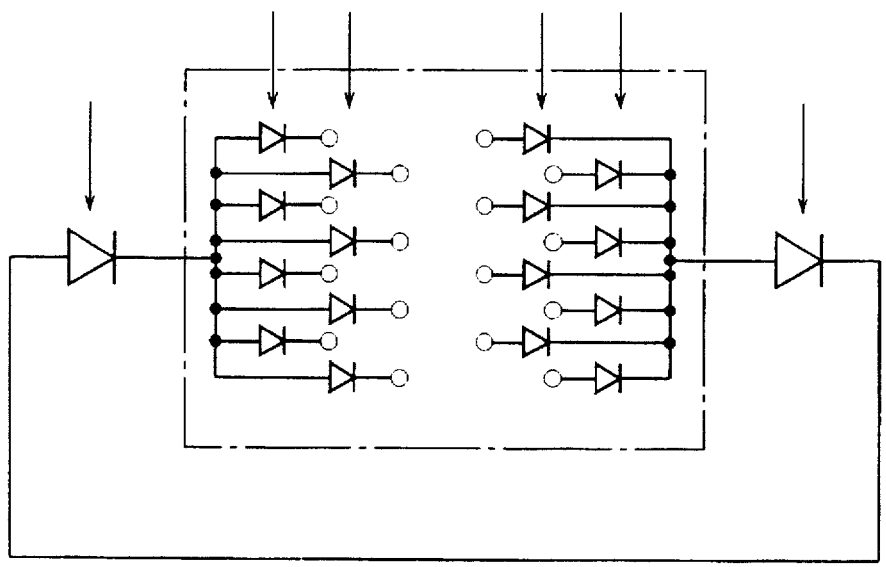
FIG. 7 is an equivalent electrical circuit drawing of the electrolytic device of FIGS. 6(a)–(c).

Example 4 is an electrolytic device and is explained in conjunction with FIGS. 6(a), (b) & (c) and FIG. 7.

This electrolytic device 50 comprises the following components;

1. the same photo cells 31 and 41 as in Example 3;
2. a substrate 18 made from insulating ceramic on which these two photo cells 31 and 41 are anchored;
3. an electrolytic cell 20 made from the aforementioned hard glass and which impermeably encloses photo cells 31 and 41; and
4. the same diaphragm 9 as that used in Example 3. The substrate 18, however, is made from insulating ceramic wider than the area of the bottom surface of the electrolytic cell 20 and its surface and internal parts are wired with conductive material, whereas the entire substrate 8 of the previous example is made from conductive material. The conductive surface on the top of the substrate is divided into two parts—18a and 18b. Photo cell 31 is electrically connected to conductive surface 18a and photo cell 41 is electrically connected to conductive surface 18b.

This electrolytic device 50 is also equipped with flat silicon solar cells 51 and 61 having conventional pn junctions, on top of the surface of substrate 18 which spreads out from the electrolytic cell 20. These external solar cells 51 and 61 are connected in series to each of the lower electrodes of the aforementioned two photo cells, via conductive surfaces 18a and 18b which are formed on the surface of substrate 18.

Following is the method used for the fabrication of electrolytic device 50.

First, the photo cells are manufactured in the same way as are those in Example 1, with the exception that an anti-reflection coating 17 is formed as is the case with Example 3, then a portion of the top of each of the photo cells is removed and surface electrodes 34 and 44 are formed in the resultant space by electroless deposition or vaporization.

Separately, the substrate 18 is created by forming ceramic powder along with an organic solution into a sheet into which through holes are created. The through holes are made by punching holes in the sheet then filling them with a metal having a high melting point, such as molybdenum or tungsten. This sheet is fired at a high temperature in the mid range between 1,000° G and 2,000° C., after which silver (Ag) paste is printed in an electrical connection pattern and baked onto both top and bottom of the sheet, thereby completing the substrate 18.

Photo cells 31 and 41, diaphragm 9, and electrolytic cell 20 are sealed with an insulating layer 36 of low-melting-point glass. The conductive surface of substrate 18 and photo cells 31 and 41 are then attached to each other by soldering. Next, the lower electrodes of the external solar cells 51 and 61 are soldered to the conductive surface on the substrate that extends outward electrolytic cell 20, and the surface electrode of the external solar cells are connected to the aforementioned through holes 18c via the conductor fragments 18d. Following this, the cells and the conductor fragments are set in a mold as a whole with transparent resin 18e, completing the electrolytic device.

This electrolytic device 50 has two external solar cells connected in series to the photo cells within the electrolytic cell. The external solar cells receive sunlight, after it passes through the transparent resin, and produce photovoltaic power. The total voltage generated between the surface electrodes (cathodes and anodes) on photo cell 31 and photo cell 41 is between 2.0 and 2.4 volts when there is at least 60 mW×cm$^{-2}$ worth of irradiated solar energy. This enables the electrolysis of water which was not possible with electrolytic device 10 of Example 2 or electrolytic device 10 of Example 2 or electrolytic device 30 of Example 3. If, for example, electrolytic device 50 is filled with a 0.5M—$H_2SO_4$ aqueous solution and irradiated by sunlight, hydrogen gas is generated on each of the surface electrodes (cathodes) 34 of light receiving section 31 side and oxygen gas is generated on each of the surface electrodes (anodes) 44 of light receiving section 41 side.

Examples of variations

This invention is not limited to the embodiments given as illustrations above, and can be applied in the form of the following variations insofar as it satisfies the conditions of the structure indicated in the claims.

Instead of using silicon semiconductor as the base material, germanium (Ge), a mixed crystal of silicon and germanium (Si-Ge), silicon carbide (SiC), gallium arsenide (GaAs), indium phosphide (InP), or other compound semiconductor single or multiple crystals may be used.

Instead of using glass for insulating layers, when the construction is such that the object being insulated (a photo diode, etc.) is not to come in contact with the electrolyte, epoxy resin or polyimide resin may be used.

The electrolytic cell may be made using ceramic instead of hard glass.

The external solar cells may be spherical or curved instead of flat. The crystal form may be polycrystal or amorphous instead of single crystal and its chief components may be gallium arsenide (GaAs), indium phosphide (InP), copper indium diselende ($CuInSe_2$), cadmium sulfide (CDs), or cadmium telluride (CdTe), instead of silicon. Not only is it not necessary for the external solar cells to be anchored to the same substrate, but neither is it absolutely necessary for it to be a series comprised of two types of solar cells made from a p-type wafer and n-type wafer. External solar cells may be used to supplement the voltage of the unit only when the photovoltaic power of the photo cells located within the electrolytic cell is not sufficient to create the voltage required for electrolysis. Arranging silicon amorphous solar cells in series on the same substrate enables adjustment of the voltage output.

Industrial Applicability

The photo cells of this invention have spherical light receiving sections, enabling the absorption of sunlight from every angle. This enables the effective use of light-energy sources in limited space, even with compact devices. These photo cells feature high reliability, because they have little leakage at the pn junction edges and little fluctuation.

The electrolytic devices of this invention have a plurality of spherical light receiving sections at the bottom of an electrolytic cell filled with electrolyte. This enables light to be taken in highly efficiently and reflection loss to be made lower than arrangements in which light is irradiated directly onto a light receiving section surface from a gaseous environment. The electrodes that perform the electrolysis also serve as the surface electrodes for the light receiving sections and the combination of p-type and n-type base materials as well as the electrodes on the same side of a light receiving section are in common, enabling the entire unit to be easily fabricated in a compact way and making the electrical connection simple.

I claim:

1. A photo cell comprising:

a base material, the base material being a p-type or n-type semiconductor and having a surface;

a light receiving section, the light receiving section being an integral spherical part of the base material which part protrudes outward from the surface of the base and has a semiconductor layer of conductivity type opposite to that of the base material, said semiconductor layer being formed on a surface of said spherical part so that a pn junction interface is formed between the base material and the semiconductor layer;

a front surface electrode formed from conductive material in ohmic contact with a portion of the semiconductor layer on the surface of the spherical part; and a back electrode formed from conductive material on the underside of the base material in ohmic contact therewith.

2. The photo cell of claim 1, wherein the semiconductor is silicon.

3. The photo cell of claim 1, wherein a layer of insulation is formed on the surface of the base material up until it covers a portion of the surface of the sphere and an edge of the pn junction is lower in position than a surface of said insulation layer, so that the edge is covered by the insulation layer.

4. The photo cell of claim 3, wherein the layer of insulation is glass.

5. The photo cell of claim 3, wherein the front surface electrode is found on the surface of said insulation layer.

6. The photo cell of claim 5, wherein the front surface electrode is made from material possessing photoreflective characteristics.

7. The photo cell of claim 1, further comprising a container adhered to a side of the base material with glass, the container surrounding the base material and the light receiving section thereof.

8. The photo cell of claim 1, including a plurality of light receiving sections protruding from the surface of said base material and the back electrode is common to these plural light receiving sections.

9. An electrolytic device comprising:

two photo cells according to claim 1, the cells having base materials of different conductivity types from each other;

a substrate having two separated conductive surfaces and separately supporting the two photo cells thereon;

an electrolytic cell surrounding the two photo cells and fixed in place on the substrate so as to be liquid-impermeable;

electrolyte filling the electrolytic cell and the space in contact with the surfaces of the spherical parts of the two photo cells and each front surface electrode;

a diaphragm separating the front surface electrodes of the photo cells that have base materials of different conductivity types from each other; and external solar cells electrically connected in series with the two types of photo cells positioned exteriorly of the electrolytic cell;

so that a total of photovoltaic power generated by the light receiving sections of the two types of photo cells and photovoltaic power supplied by the external solar cells causes electrolysis of the electrolyte.

10. An electrolytic device comprising:

a photo cell array according to claim 9;

electrolyte filling a space between each of the front surface electrodes; and a diaphragm separating the front surface electrodes of said two photo cells that have base material of different conductivity types from each other;

so that photovoltaic power generated by the light receiving sections causes electrolysis of the electrolyte.

11. A photo cell array comprising:

two photo cells according to claim 1, the conductivity types of the base materials of said photo cells being different from each other; and a common substrate having a conductive surface on which said two photo cells are formed, the conductive surface being joined with each of the back electrodes to provide a series electric connection of said two photo cells.

12. The electrolytic device of claim 11, wherein the electrical connection between the photo cells within the electrolytic cell and the external solar cells is such that the supporting surface of the substrate protrudes outwardly from the electrolytic cell, and connecting wiring is formed either within the substrate or on its surface, with the external solar cells affixed to said protruding substrate surface and connected in series by the wiring to the two types of photo cells.

* * * * *

UNITED STATES PATENT AND TRADEMARK OFFICE
CERTIFICATE OF CORRECTION

PATENT NO. : 5,785.768
DATED : July 28, 1998
INVENTOR(S) : Josuke Nakata

It is certified that error appears in the above-indentified patent and that said Letters Patent is hereby corrected as shown below:

Column 13, claim 10, line 2, "claim 9" should read --claim 11--.

Signed and Sealed this

Twenty-ninth Day of June, 1999

Attest:

Q. TODD DICKINSON

*Attesting Officer*   *Acting Commissioner of Patents and Trademarks*